(12) United States Patent
Meyer et al.

(10) Patent No.: US 8,020,080 B2
(45) Date of Patent: Sep. 13, 2011

(54) RECEIVE CIRCUIT

(75) Inventors: Jacques Meyer, Saint-Martin-le-Vinoux (FR); Bruno Paille, Engins (FR)

(73) Assignee: STMicroelectronics S.A., Montrouge (FR)

( * ) Notice: Subject to any disclaimer, the term of this patent is extended or adjusted under 35 U.S.C. 154(b) by 1050 days.

(21) Appl. No.: 11/729,621

(22) Filed: Mar. 29, 2007

(65) Prior Publication Data

US 2007/0229344 A1    Oct. 4, 2007

(30) Foreign Application Priority Data

Mar. 29, 2006    (FR) ...................................... 06 51084

(51) Int. Cl.
*H03M 13/00*  (2006.01)
(52) U.S. Cl. ........ 714/784; 714/756; 714/786; 714/794; 714/795; 375/341; 375/262
(58) Field of Classification Search ................... 714/784, 714/756, 762, 788, 795, 794; 375/341, 262
See application file for complete search history.

(56) References Cited

U.S. PATENT DOCUMENTS

| | | | |
|---|---|---|---|
| 5,369,500 A * | 11/1994 | Jacobs | 358/406 |
| 2003/0179733 A1* | 9/2003 | Yano | 370/335 |
| 2004/0063427 A1* | 4/2004 | Narasimha et al. | 455/434 |
| 2004/0194005 A1 | 9/2004 | Huggett | |
| 2004/0261002 A1 | 12/2004 | Eidson et al. | |
| 2007/0040938 A1* | 2/2007 | Choi et al. | 348/470 |

OTHER PUBLICATIONS

French Search Report from French Patent Application 06/51084, filed Mar. 29, 2006.
Hagenauer J., Offer E., Papke L.: "Improving the Standard Coding System for Deep Space Missions" IEEE International Conference on Communications, Supercomm, vol. 2, May 23, 1993, pp. 1092-1097.

* cited by examiner

*Primary Examiner* — Guy J Lamarre
(74) *Attorney, Agent, or Firm* — Lisa K. Jorgenson; James H. Morris; Wolf, Greenfield & Sacks, P.C.

(57) ABSTRACT

A method and a circuit for decoding a coded signal including a first decoding system capable of receiving the coded signal and of providing a first signal comprising portions considered correct and a second decoding system capable of providing a second signal from the coded signal and from portions considered correct of the first signal.

22 Claims, 9 Drawing Sheets

Fig 19 ns of 7 successive bits of signal S'', that is, the 6 values stored by flip-flops 20 to 25 and the value of the bit positioned at the input of flip-flop 20.

RECEIVE CIRCUIT

BACKGROUND OF THE INVENTION

1. Field of the Invention

The present invention generally relates to receive circuits, for example, receive circuits which comprise two decoders separated by a deinterleave device.

Such circuits are, for example, used to decode digital video signals that can originate by radio channel from a satellite (standard DVB-S, DVB-DSNG, DirectTV, etc) or from a terrestrial base (standard DVB-T, DVB-H, ISDB, ISDB-T, ATSC, etc) or that can be conveyed by a cable (standard DVB-C, Docsis, etc).

2. Discussion of the Related Art

Figure 1:
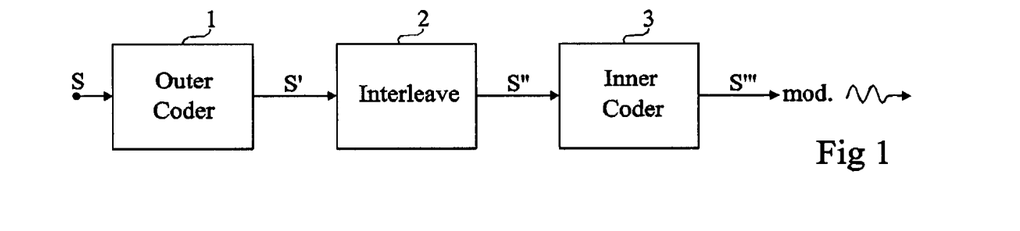
FIG. 1 is a diagram of a circuit for transmitting coded signals.
Figure 2:
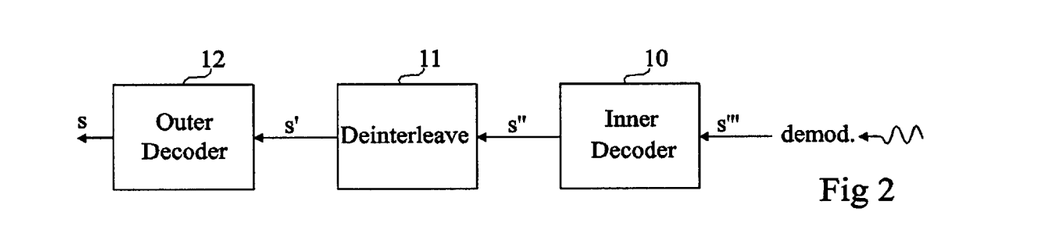
FIG. 2 is a diagram of a circuit-for receiving coded signals.

FIGS. 1 and 2 are diagrams respectively illustrating the elements of a transmit circuit providing a coded signal and those of a receive circuit used to decode such a coded signal.

The transmit circuit of FIG. 1 successively comprises an encoder 1, called an outer encoder, an interleave device 2, and an encoder 3, called an inner encoder. Encoder 1, for example, operates by means of a code of Reed Solomon, BCH, Hamming, etc. type. Encoder 1 receives a digital signal S to be coded and provides a signal S' to interleave device 2. Encoder 1 generally operates by packets formed of words or multiplets, each comprising a given number of bits, 8 in the case of bytes. Interleave device 2 mixes together the multiplets of the different packets of signal S'. Encoder 3 performs a coding, for example, by means of a convolutional code, of a Turbo code, of an LDPC code, etc. Code 3 receives a signal S'' from device 2 and provides a signal S''', for example formed of symbols which are modulated to provide an electromagnetic signal. For example, a quadrature phase shift keying modulation QPSK is used. For example, to provide signals of DVB-S type, transmit circuits where encoder 1 is an encoder of Reed-Solomon type and encoder 3 is a convolutional-type encoder are currently used.

In FIG. 2, the receive circuit receives an electromagnetic signal which, after demodulation, turns into a coded signal s'''. Signal s''' is successively processed by a decoder 10 called an inner decoder, a deinterleave device 11, and a decoder 12 called an outer decoder. Decoder 10 performs an operation inverse to that of encoder 3 and provides a signal s'' to deinterleave device 11. Deinterleave device 11 operates inversely to interleave device 2 and places the multiplets of each packet back in the order where they were before interleaving. Decoder 12 receives a signal s' from device 11 and performs an operation inverse to that of encoder 1. Decoder 12 provides a decoded digital signal s. When encoder 3 is an encoder of convolutional type, decoder 12 generally implements a Viterbi algorithm.

Figure 3:
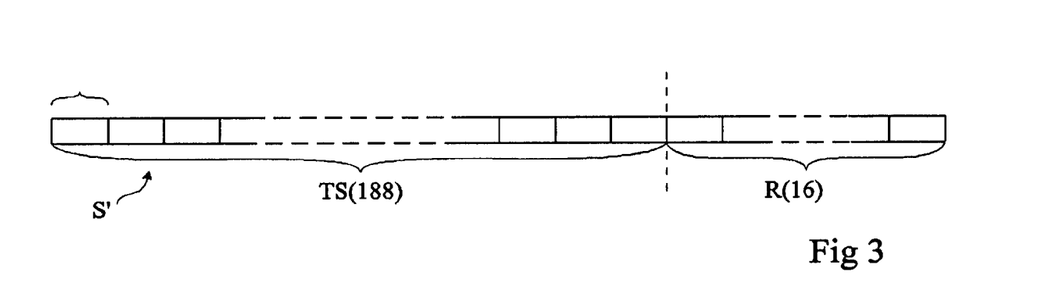
FIG. 3 schematically shows a portion of a digital signal provided by an encoder of "Reed-Solomon"-type.

FIG. 3 is an example of a digital signal S' provided by encoder 1. In FIG. 3, each packet comprises 188 data multiplets TS, corresponding to multiplets of the digital signal S received by encoder 1, and 16 redundancy multiplets R introduced by encoder 1. The value of redundancy multiplets R is a function of the value of multiplets TS.

Figure 4:
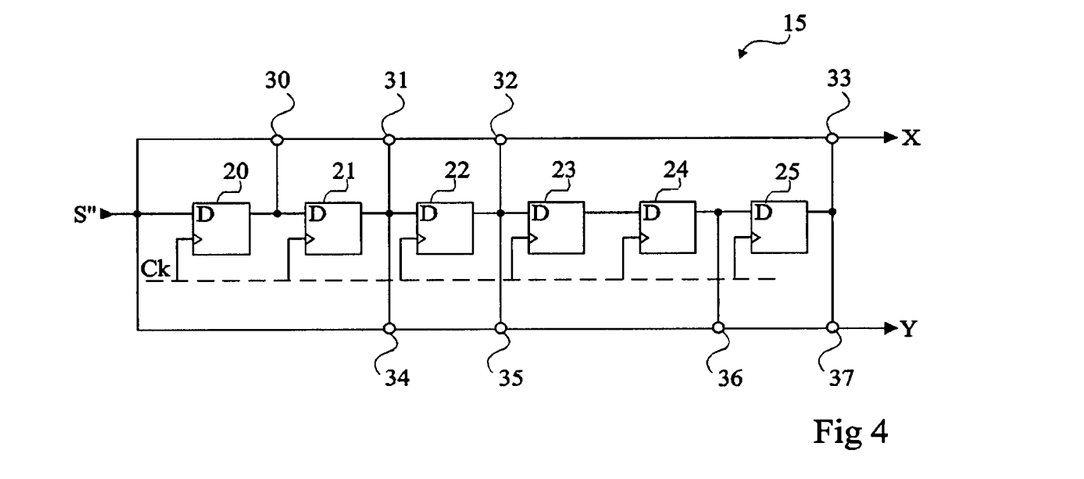
FIG. 4 is a diagram of an example of a convolutional encoder.

FIG. 4 shows a convolutional encoder 15 that may be used as an encoder 3. Encoder 15 comprises six D flip-flops 20 to 25, the output of flip-flop 20 being connected to the input of flip-flop 21, and so on. Flip-flop 20 receives signal S''. The flip-flops are controlled by a clock signal Ck so that they store the value "0" or "1" present on their input on the rising edge or the falling edge of the clock signal. Encoder 15 further comprises 8 XOR-type gates 30 to 37. Gate 30 receives signal S'' and the output of flip-flop 20. Gate 31 receives the output of gate 30 and the output of flip-flop 21. Gate 32 receives the output of gate 31 and the output of flip-flop 22. Gate 33 receives the output of gate 32 and the output of flip-flop 25. Gate 34 receives signal S'' and the output of flip-flop 21. Gate 35 receives the output of gate 34 and the output of flip-flop 22. Gate 36 receives the output of gate 35 and the output of flip-flop 24. Gate 37 receives the output of gate 36 and the output of flip-flop 25. Gate 33 outputs a digital signal X and gate 37 outputs a digital signal Y, the couples of values X and Y forming the output signal of encoder 15.

The bits of signal S'' are successively input into encoder 15 and propagate from flip-flop to flip-flop at the rate of clock signal Ck. Signals X and Y are, as for them, formed of a bit sequence output by encoder 15 at the rate of clock signal Ck.

It should be noted that each bit of signal X or Y is a combination of part of the values of 7 successive bits of signal S'', that is, the 6 values stored by flip-flops 20 to 25 and the value of the bit positioned at the input of flip-flop 20.

Figure 5:
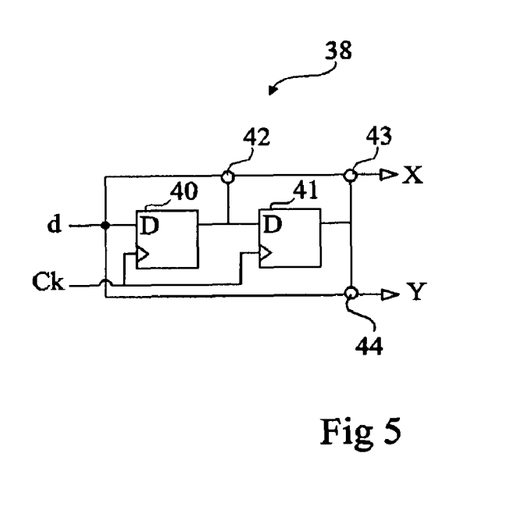
FIG. 5 is a diagram of a simple example of a convolutional encoder.

FIG. 5 is a diagram of a convolutional encoder 38 comprising two bits only.

In FIG. 5, flip-flops 40 and 41 are series-connected, the output of flip-flop 40 being connected to the input of flip-flop 41. Flip-flop 40 receives a data signal d. The flip-flops are controlled by a clock signal Ck. Encoder 38 further comprises three XOR gates 42, 43, and 44. Gate 42 receives signal d and the output of flip-flop 40. Gate 43 receives the output of gate 42 and the output of flip-flop 41. Gate 44 receives signal d and the output of flip-flop 41. Gates 43 and 44 provide signals also noted as X and Y.

Figure 6:
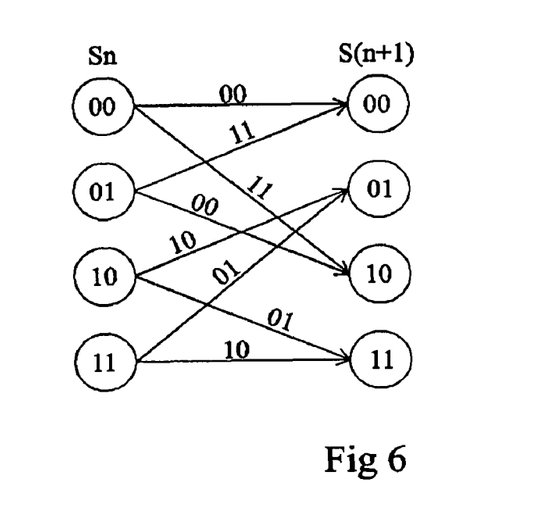
FIG. 6 is a diagram illustrating the possible state switchings of the flip-flops of the encoder of FIG. 5.

FIG. 6 illustrates the possible state switchings of flip-flops 40 and 41. Each flip-flop can store a "1" or a "0". The possible combinations of values stored by the pair of flip-flops 40, 41, 4 in number, are 00, 01, 10, and 11. Each possible combination is represented by a circle in which the values of the combination are written. Four circles corresponding to the couples of possible values of the flip-flops at a time n, n being an integer, are shown in a column to the left of the drawing. Similarly, four circles corresponding to the couples of possible values of the flip-flops at a time n+1 are shown in a column to the right of the drawing. The state of the flip-flops at time n is called $S_n$. After a clock cycle enabling switching from state $S_n$ to a state $S_{(n+1)}$, flip-flop 41 stores the value previously stored by flip-flop 40 and flip-flop 40 stores the value of data signal d. A new value of data signal d further appears at the input of flip-flop 40.

Calling $d_n$ the value of signal d at time n, the values of signals X and Y at time n are defined as follows:

| $d_n$ | $d_{(n-1)}$ | $d_{(n-2)}$ | X | Y |
|---|---|---|---|---|
| 0 | 0 | 0 | 0 | 0 |
| 1 | 0 | 0 | 1 | 1 |
| 0 | 0 | 1 | 1 | 1 |
| 1 | 0 | 1 | 0 | 0 |
| 0 | 1 | 0 | 1 | 0 |
| 1 | 1 | 0 | 0 | 1 |
| 0 | 1 | 1 | 0 | 1 |
| 1 | 1 | 1 | 1 | 0 |

In the case, for example, where flip-flops 40 and 41 are at state "00" at time n, signals X and Y have as values 00 or 11 respectively according to whether data signal d is equal to 0 or 1. At time n+1, flip-flops 40, 41 are at state 00 or 01 respectively according to whether signals X, Y are equal to 00 or 11 at state n. Two arrows corresponding to these two possibilities are shown in FIG. 6 between the circle corresponding to state 00 at time n shown to the left and the circles corresponding to states 00 and 10 at time n+1 shown to the right. The numbers indicated above each of the arrows correspond to the values of signals X, Y at time n.

Similarly, each other circle corresponding to a possible state $S_n$ is connected to the two other circles corresponding to two possible states $S_{(n+1)}$ by arrows. Above each of the arrows are written the values of signals X, Y at time n enabling passing from state $S_n$ corresponding to the starting circle of the arrow to state $S_{(n+1)}$ corresponding to the arrival circle of the arrow.

All the possibilities of state switchings of flip-flops 40 and 41 on reception of a data signal d comprising a number N of successive bits may be represented by means of a "lattice" comprising N+1 columns of four circles. Each column corresponds to a state $S_n$ of flip-flops 40 and 41, the column corresponding to state $S_{(n+1)}$ being placed to the right of the column corresponding to state $S_n$. The leftmost column shows initial state $S_0$ of the flip-flops before inserting the first value of data signal d into flip-flop 40. The rightmost column shows state $S_N$ of the flip-flops after insertion into flip-flop 40 of the last value of data signal d. Each circle of a column is connected to two other circles of the next column by arrows on which are written the values of signals X, Y enabling passing from one circle to the other. Further, each circle of a column is connected to two other circles of the preceding column.

A data signal d may be represented by means of such a lattice in which all the arrows except one arrow corresponding to that connecting the two states $S_n$ and $S_{(n+1)}$ observed after the input of the n-th and of the (n+1)-th value of signal d in flip-flop 40 have been eliminated between each pair of columns corresponding to states $S_n$ and $S_{(n+1)}$.

To restore a data signal d provided at the input of encoder 38 of FIG. 5, the decoder must find which were the successive states of flip-flops 40 and 41 based on the values of received signals X', Y' which, to within the transmission errors, correspond to the transmitted signals X, Y. Especially, values X', Y' generally do not have well-defined values 0 or 1 (called "hard" bits) but generally exhibit real values, of analog type (called soft bits). The method for searching the successive states of flip-flops 40, 41 comprises, based on a complete lattice, progressively eliminating arrows to obtain a "single" path between the lattice columns. For this purpose, the lattice is examined from left to right along the reception of signals X', Y' by eliminating arrows of the lattice as described schematically hereafter, in relation with FIG. 7, which illustrates the method implemented by a Viterbi decoder.

Figure 7:
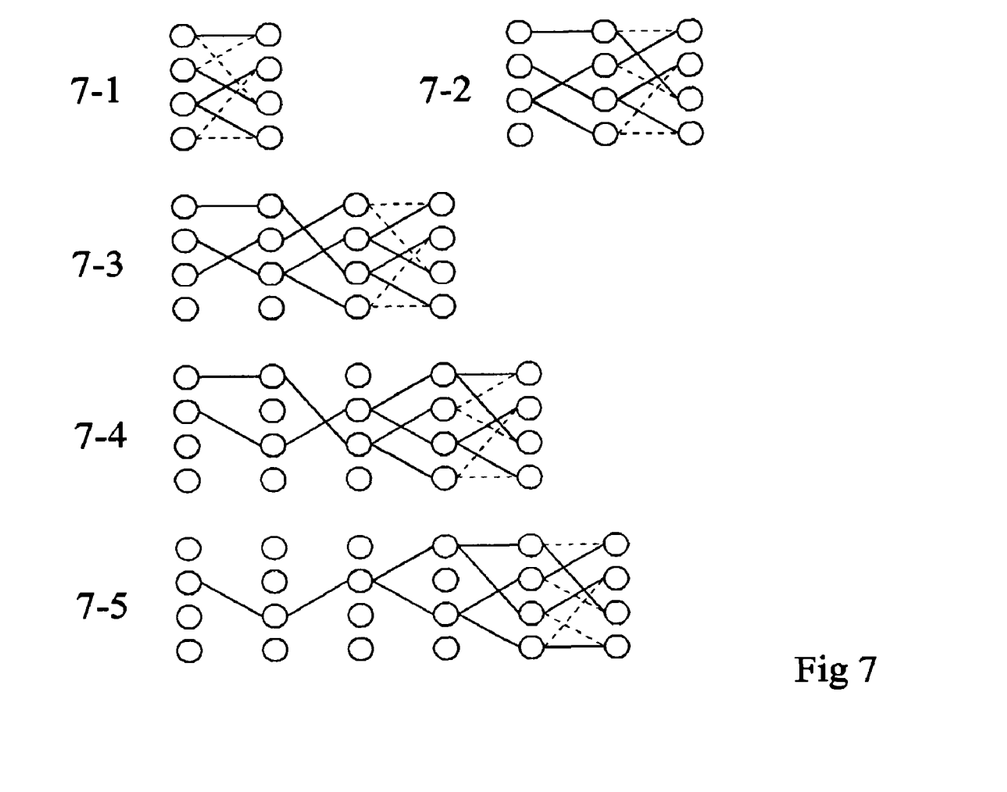
FIG. 7 is a diagram of a lattice showing the method implemented by a Viterbi decoder.

Couples p1, p2, p3, and p4 of possible values are first defined for signals X', Y', with for example p1="00", p2="01", p3="10", and p4="11". On reception of a new set of values of signals X', Y', a number c called "cost" which is all the higher as the received set of values X', Y' is different from the considered couple is assigned to each of couples p1 and p4. In a simple example where received values X' and Y' are assimilated to bits 0 or 1, if the received set of values X', Y' is 00, a cost c(00) equal to 0 may be assigned to couple p1 equal to 00, couples p2 and p3, which differ by one bit with respect to the received couple, receiving costs c(01) and c(10) equal to 1 and couple p4, the two bits of which are different from the received bits, receiving a cost c(11) equal to 2.

FIG. 7 comprises a series of diagrams 7-1 to 7-5 showing the progress of the elimination of the lattice arrows along the reception of signals X', Y'.

A cumulated cost is assigned to each state shown by a circle. At the beginning of the decoding, the cumulated costs are for example all set to zero. After reception of the first set of values X', Y', a cost or metric is determined for each couple p1 to p4. A cumulated cost equal to the cumulated cost of the circle of origin of the arrow plus the cost associated with couple p1 to p4 corresponding to this transition is then calculated for each of the two arrows arriving on a given circle of the second column. The arrow corresponding to the highest cost is eliminated, after which the cumulated cost of the remaining arrow is assigned to the circle.

On reception of the second set of values X', Y', a new cost is determined for each couple p1 to p4. A cumulated cost equal to the cumulated cost of the original circle of the arrow in the second column plus the cost associated with the couple p1 to p4 corresponding to this transition is then calculated as previously for each of the two arrows arriving on a given circle of the third column. The arrow corresponding to the highest cost is eliminated, after which the cumulated cost of the remaining arrow is assigned to the circuit of the third column. Arrows which arrive on a circle from which no arrow starts back towards the next column can thus be eliminated. In the example of FIG. 7 (diagram 7-3), the arrow starting from the third circle of the first column and arriving on the fourth circle of the second column is thus eliminated.

It is thus continued for each new received set of values X', Y'. The cumulated cost of each circle of the last column appears to be the sum of the costs of each arrow forming the single path leading to this circle. As visible on diagram 7-5, after a number of received values X', Y', there only remains a single arrow between the first and second columns and between the second and third columns. The first three states $S_0$, $S_1$, and $S_2$ of the flip-flops can then be noted and the first two values of signal d which is desired to be restored can be deduced therefrom. In the example of FIG. 7, $S_0$=01, $S_1$=10, and $S_2$=01, the flip-flops were thus initially positioned at 01, after which the values of signal d have successively been 1, then 0.

Figure 8:
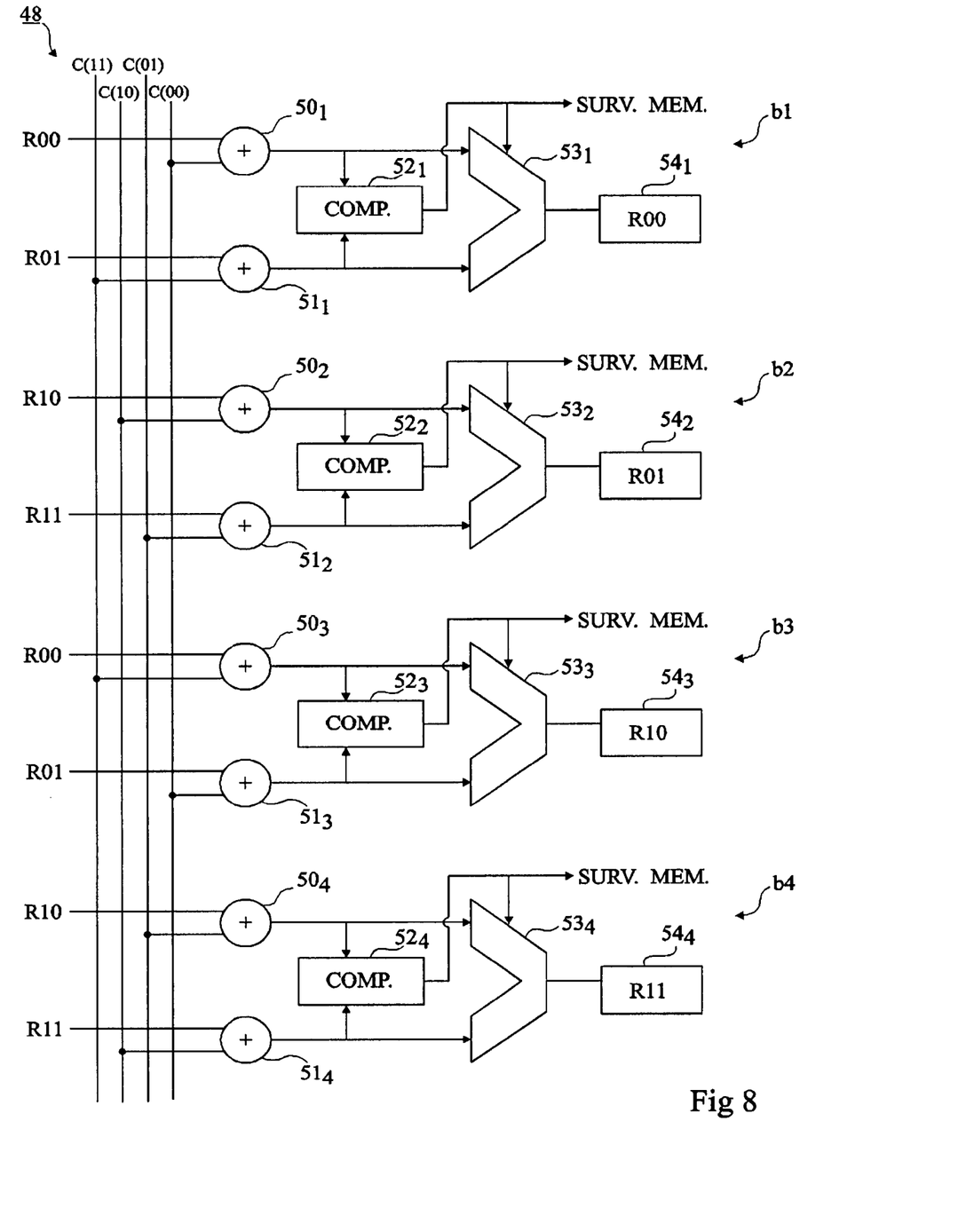
FIG. 8 is a diagram of a portion of a Viterbi decoder corresponding to the encoder of FIG. 5.

FIG. 8 is a diagram of a portion of a decoder 48 enabling implementing the above-described decoding method. Decoder 48 comprises four blocks b1, b2, b3, and b4 of identical structures. The j-th block, with j ranging between 1 and 4, comprises two adders $50_j$ and $51_j$ having their outputs connected to a comparator $52_j$ and to two inputs of a multiplexer $53_j$. The output of multiplexer $53_j$ is connected to a register or accumulator $54_j$. Multiplexer $53_j$ is controlled by comparator $52_j$.

Registers $54_1$ to $54_4$ are respectively called R00, R01, R10, R11. Each register R00 to R11 is used to store the cumulated metric associated with each circle of the n-th column after reception of the n-th set of values X', Y'. Thus, register R00 is associated with the circle corresponding to state $S_n$=00 and so on.

Further, costs c(00), c(01), c(10), and c(11) associated with couples p1 to p4 are provided on lines also called c(00), c(01), c(10), and c(11).

In the case of first block b1, the inputs of adder $50_1$ are connected to register R00 and to line c(00). The inputs of adder $51_1$ are connected to register R01 and to line c(11). It should be noted that these connections to adders $50_1$ and $51_1$ can be deduced from the diagram of FIG. 6. Thus, referring to FIG. 6, it is possible to deduce the connections to the adders of the other decoder blocks.

The operation of decoder 48 is the following. When an n-th set of values X', Y' is received, the lines of costs c(00) to c(11) are updated. Each j-th block then performs the following operations. Adders $50_j$, $51_j$ are activated and each provide a sum value. Comparator $52_j$ then determines which is the lowest sum and controls multiplexer $53_j$ so that the lowest sum is stored in register $54_j$. This comparison and storage operation corresponds to the elimination of one of the two arrows arriving on the circle associated with register $54_j$ and to the calculation of the cumulated metric associated with this circle.

Further, comparator $52_j$ of each block j is connected to a memory called a "survivor memory" which enables determining the most probable path followed by the transitions between states, for example, by storing the remaining arrows after each add/compare/store cycle performed after arrival of a new set of values X', Y'.

The decoder described hereabove in relation with FIG. 8 uses a Viterbi algorithm and enables decoding of data coded by a convolutional encoder with two flip-flops. A Viterbi decoder corresponding to a convolutional encoder comprising more flip-flops, such as that of FIG. 4, may easily be designed according to the above-described principle.

Referring to FIG. 2, decoder 12 analyzes each packet of multiplets coming from deinterleave device 11 and determines, based on the redundancy multiplets, whether or not there are erroneous multiplets in the packet. If the number of erroneous multiplets is not too high, the latter are corrected. The decoder then eliminates the redundancy multiplets and transmits a corrected signal s only formed of the data multiplets.

The decoding and/or reception circuits described hereabove enable eliminating a number of errors introduced into the signals on transmission thereof between the transmit circuit and the receive circuit.

However, when the transmission media are significantly noisy, the number of corrected errors is insufficient. Such is for example the case when the transmissions are performed by radio channel, especially from a satellite.

SUMMARY OF THE INVENTION

An object of the present invention is to provide a circuit which enables correcting more errors than prior art circuits.

Another object of the present invention is to provide such a circuit of simple structure.

To achieve these objects, as well as others, the present invention provides a circuit for decoding a coded signal comprising:

a first decoding system capable of receiving the coded signal and of providing a first signal comprising portions considered correct; and a second decoding system capable of providing a second signal from the coded signal and from portions considered correct of the first signal.

According to an embodiment of the present invention, the first decoding system comprises a first decoder, a first deinterleave device coupled to the first decoder, and a second decoder coupled to the first deinterleave device; the second decoding system comprises a third decoder, a second deinterleave device coupled to the third decoder, and a fourth decoder coupled to the second deinterleave device.

According to an embodiment of the present invention, the third decoder is coupled to a delay device receiving the coded signal and to the second decoder via an interleave device.

According to an embodiment of the present invention, the signal provided by the interleave device is formed of multiplets comprising validity bits indicating whether the multiplets are correct.

According to an embodiment of the present invention, the first decoder is a decoder using a Viterbi algorithm, and the second and fourth decoders are error-correction decoders of Reed-Solomon type.

According to an embodiment of the present invention, the third decoder comprises a set of registers storing a periodically-updated metric, and control means capable of forcing the content of the registers to a determined value according to the values of the signal provided by the first decoding system.

According to an embodiment of the present invention, the control means detect the correct multiplets of the first signal and control the positioning of the registers for each sequence of n consecutive bits belonging to correct multiplets.

According to an embodiment of the present invention, the third decoder comprises an encoder coupled to the interleave device and a multiplexer which respectively receives on first and second inputs the signal provided by the delay device and the signal provided by the encoder and provides a signal to a fifth decoder, the multiplexer being controlled by a control device acting according to the validity of the signal supplying the encoder.

The present invention also provides a receive circuit comprising first and second receive channels enabling receiving two distinct coded signals, the first receive channel comprising a first demodulator coupled to a first decoding circuit and the second receive channel comprising a second demodulator coupled to a second decoding circuit, the circuit further comprising a multiplexer with two inputs and one output, a delay device, and a control device, the delay device being coupled to the first demodulator and the inputs of the multiplexer being respectively coupled to the second demodulator and to the delay device, the control device comprising means for generating a corrected signal from signals provided by the first decoding circuit and means for controlling the second decoding circuit, a selection signal controlling the multiplexer and the control device, such that, when the selection signal is positioned to let through the signal provided by the delay device, the association of the decoding circuits of the first and second channels, of the delay device, and of the control device forms a decoding circuit such as defined hereabove.

The present invention also provides a receive circuit comprising a first demodulator, a second demodulator, the first and second demodulators being coupled to a recombination device, and a decoding circuit such as defined hereabove coupled to the recombination device.

The present invention also provides a method for decoding a coded signal comprising the steps of:

decoding the coded signal, by implementing a Viterbi algorithm, to provide a first signal formed of a series of multiple packets;

identifying possible errors present in the first signal, by means of redundancy multiplets comprised in each packet;

correcting all or part of the erroneous multiplets of the first signal to form a predecoded corrected signal comprising indications as to the validity of the multiplets;

providing a delayed coded signal;

decoding the delayed coded signal, by implementing a modified Viterbi algorithm by the use of the information obtained from the correct multiplets of the corrected predecoded signal, to provide a second predecoded signal; and identifying and correcting all or part of possible errors present in the second predecoded signal; and eliminating the redundancy multiplets of the second predecoded signal to provide a decoded signal.

The foregoing and other objects, features, and advantages of the present invention will be discussed in detail in the following non-limiting description of specific embodiments in connection with the accompanying drawings.

DETAILED DESCRIPTION

For clarity, the same elements or elements partly having the same functions can be designated hereafter with the same reference numerals in the different drawings.

According to the present invention, a first decoding system receives a coded signal and provides a first signal, in which a portion at least has been corrected and is considered error-free. A second decoding system in turn decodes the coded signal by using all or only part of the portions considered error-free of the signal provided by the first decoding system. Thus, the signal provided by the second decoding system generally exhibits less errors than the signal provided by the first decoding system.

The structure of a circuit according to the present invention and the decoding method according to the present invention will be better understood by reading the examples of embodiment described hereafter.

Figure 9:
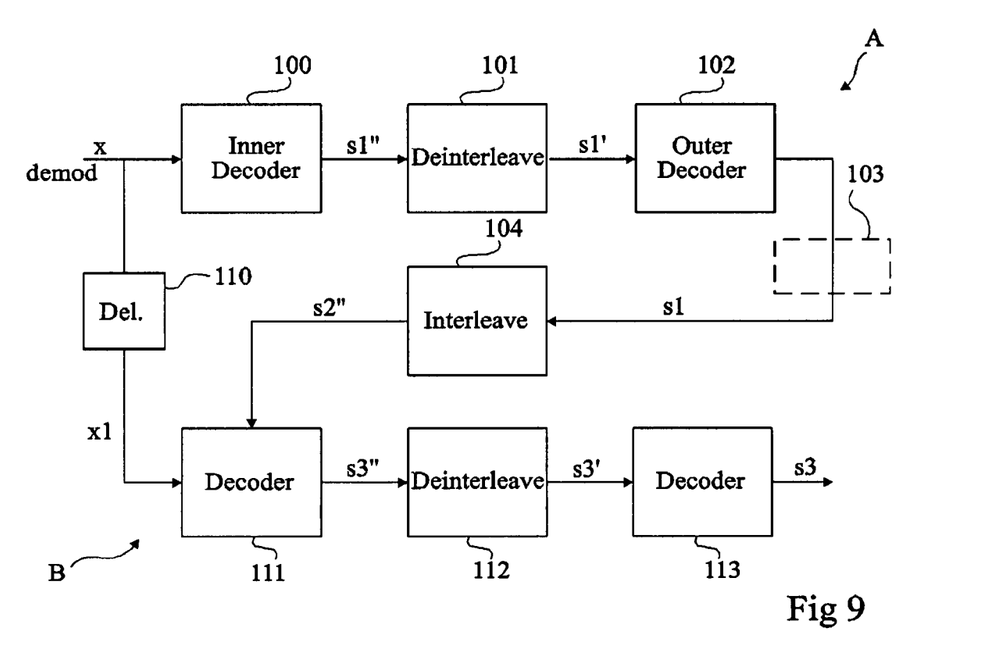
FIG. 9 is a diagram of an example of a circuit according to the present invention.

FIG. 9 is a diagram of an example of a decoding circuit according to the present invention. In FIG. 9, it is assumed that the signal has been coded by a circuit of the type of that in FIG. 1, in which the input signal has been coded by an external encoder 1 and an internal encoder 3, separated by an interleave device 2. The external encoder has added redundancy which will enable, on decoding, correcting errors and indicating the error-free portions of the signal. The internal encoder has also added redundancy in that it provides more bits than it receives.

In FIG. 9, the circuit comprises two decoding systems or chains A and B, each receiving a coded signal x resulting from the demodulation of a received signal. Chain A successively comprises an inner decoder 100, a deinterleave device 101, and an outer decoder 102. Decoder 100 decodes signal x and provides a signal s1". The deinterleave device sets the multiplets of signal s1" back in the initial order and provides a signal s1'. Decoder 102 corrects errors of signal s1' and provides a signal s1 comprising exact or assumed-to-be-exact portions with a known location.

For example, decoder 102 analyzes each packet of multiplets of signal s1' and determines, based on redundancy multiplets, whether there are or are not erroneous multiplets in the considered packet. Decoder 102 compares the number of erroneous multiplets in the considered packet with a predefined maximum number of correctable erroneous words "nmax", equal to 8 in the case where each packet has been coded by a Reed Solomon encoder and comprises, as in FIG. 3, 16 redundancy multiplets. If the number of erroneous words is lower than nmax, decoder 102 corrects the erroneous multiplets. In the opposite case, the erroneous multiplets are not corrected.

Further, decoder 102 marks the multiplets of each packet by adding to each multiplet of a packet, be the multiplet a data multiplet or a redundancy multiplet, a bit called validity bit indicating whether the packet only comprises error-free multiplets (or the errors of which have been corrected) or whether it comprises non-correctable multiplets. For example, in signal s1, all the multiplets belonging to a packet comprising no error have a validity bit equal to "0" and all the multiplets belonging to a packet comprising errors are assigned a validity bit equal to "1".

According to a variation of chain A, decoder 102 further performs an operation of elimination of the redundancy multiplets. In this case, chain A comprises an optional encoder 103, shown in dotted lines in FIG. 9. Encoder 103 has the function of recalculating and replacing redundancy multiplets in the signal. The redundancy multiplet calculation is performed according to the same method as that used by the external encoder of the transmit circuit. The validity bits are not taken into account to calculate the redundancy multiplets and, after calculation, each redundancy multiplet of a packet is assigned a validity bit identical to those assigned to the data multiplets of the considered packet.

Signal s1 provided by decoder 102 (it is assumed hereafter that encoder 103 is not present) is provided to an interleave device 104. Interleave device 104 performs a stirring of the packet multiplets identical to the stirring performed by the interleave device of the transmit circuit and provides a signal s2". It should be noted that the signal s2" provided by device 104 is a corrected version of predecoded signal s1", errors having been eliminated by decoder 102 on processing of the redundancy elements.

Figure 10:
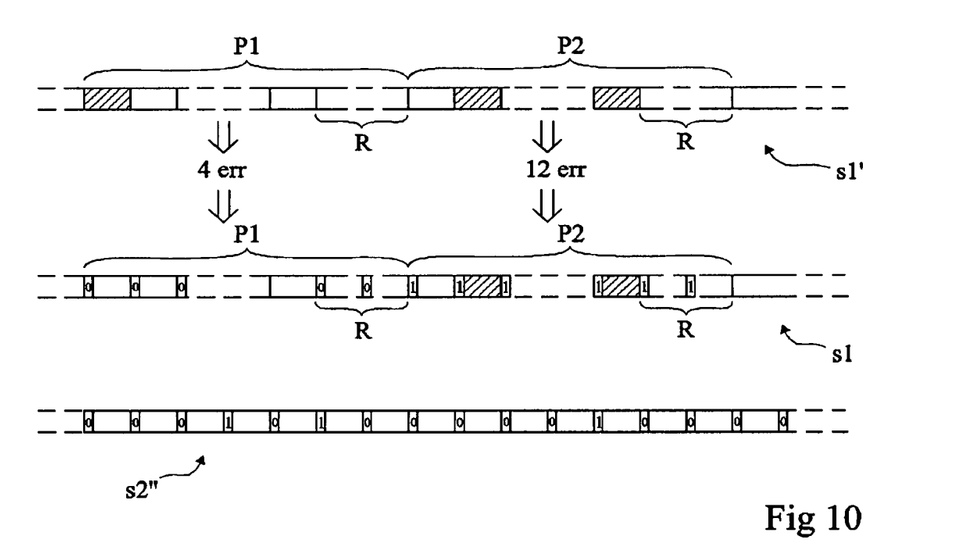
FIG. 10 is a diagram illustrating a method implemented by elements of the circuit of FIG. 9.

FIG. 10 is a diagram illustrating the shape of signals s1', s1, and s2" of the circuit of FIG. 9. Two packets P1 and P2 of signal s1' are shown. The hatched portions show erroneous multiplets. It is assumed that packet P1 comprises 4 erroneous multiplets, that packet P2 comprises 12 erroneous multiplets, and that the maximum number of correctable multiplets is $n_{max}=8$. Only the erroneous multiplets of packet P1 can be corrected by decoder 102, packet P2 comprising too large a number of erroneous multiplets. As visible in signal s1, the multiplets of packet P1 are all correct and each multiplet of this packet comprises a validity bit equal to 0. The erroneous multiplets of packet P2 are however unchanged and all the multiplets of packet P2 have a validity bit equal to 1. Each redundancy multiplet is also marked with a 1 or a 0 according to whether it respectively belongs to a packet exhibiting multiplets marked with 1s or 0s. After stirring by interleave device 104, the multiplets marked with a "1" are generally scattered among the multiplets marked with a "0" to form signal s2".

The circuit of FIG. 9 further comprises a decoding system or chain B. Chain B comprises a delay device 110 noted "Del". Device 110 receives coded signal x and provides a signal x1 respectively identical to signal x but delayed with respect to the latter. The delay introduced by device 110 corresponds to the number of clock pulses necessary for chain A to provide signal s2". Signal x1 is transmitted to a decoder 111, also called decoding device 111, which further receives signal s2" provided by device 104. Decoding device 111 uses error-free portions of signal s2" to improve the decoding of signal x1. Thus, signal s3" provided by decoding device 111 is a signal exhibiting fewer errors than signal s1" provided by decoder 100. Signal s3" is provided to a deinterleave device 112 of same function as device 101. Device 112 provides a signal s3' to a decoder 113, of same function as decoder 12 of FIG. 2. Decoder 113 provides a signal s3 which corresponds to the decoded signal provided by the circuit of FIG. 9. Due to the fact that signal s3" provided by device 111 exhibits fewer errors than signal s1' provided by decoder 100, decoder 113 of chain B can correct errors which could not be corrected by decoder 102 of chain A and the circuit of the present invention enables correcting more errors than prior art circuits.

Two embodiments of decoding device 111 are described hereafter, in relation with FIG. 11 to 15.

Figure 11:
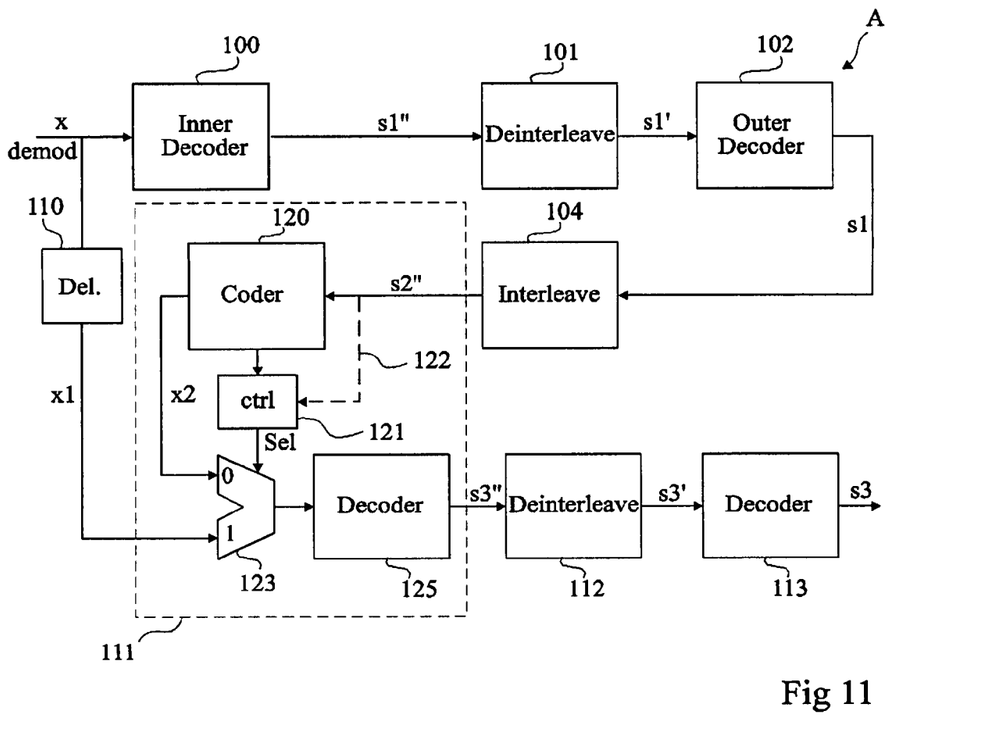
FIG. 11 is a diagram of an embodiment of the circuit of FIG. 9.

FIG. 11 shows the circuit of FIG. 9, where optional encoder 103 is not shown, with a detailed representation of a first embodiment of decoding device 111.

In FIG. 11, decoding device 111 comprises an encoder 120 which receives signal s2" provided by device 104. Encoder 120 provides a signal x2 corresponding to a corrected version of signal x. For this purpose, encoder 120 first eliminates the validity bits of signal s2". Encoder 120 codes the resulting signal in the same way as the internal encoder used on transmission. If need be, the bits of the obtained signal, which are "hard" bits, of value 0 or 1, are converted to a format comparable to that of the bits of signal x. This will especially occur when the bits of signal x are "soft" bits. In this case, the bits of signal x2 will be converted into "soft" bits, for example setting their sign to + or – according to the selected convention for the 1s and the 0s and their size, which represents the probability of having this value, to the admissible maximum for the "soft" bits of signal x.

Decoding device 111 also comprises a control device 121. Control device 121 recovers the validity bits of signal s2", either from encoder 120 when encoder 120 eliminates them, or directly from signal s2" as suggested by dotted line 122. Control device 121 elaborates, based on the validity bits, a selection signal Sel used to control a multiplexer 123.

Multiplexer 123 receives signal x1 on a first input and signal x2 on a second input. Generally, multiplexer 123 is controlled to let through the correct values of signal x2 and to let through signal x1 in the other cases, that is, when the values of signal x2 are incorrect or when it is not known whether they are correct or incorrect.

Figure 12:
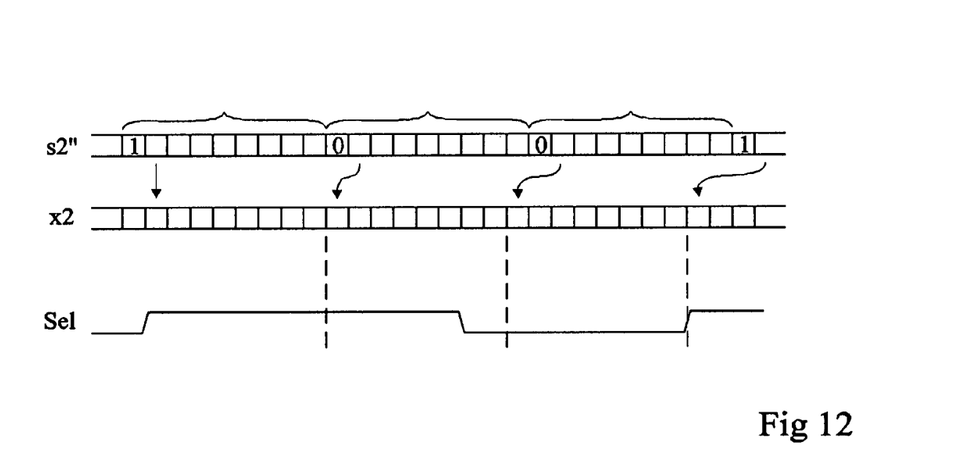
FIG. 12 is a diagram illustrating the operation of a device of the circuit of FIG. 11.

FIG. 12 illustrates, by means of signals s2", x2, and Sel, the way in which multiplexer 123 operates, in the case where encoder 120 is a convolutional encoder with six flip-flops. Although this is not shown, signal x2 is in this case formed of a sequence of two values, resulting from combinations of bits of signal s2". In the shown example, signal Sel switches to "1" as soon as the first bit of an erroneous multiplet is introduced into encoder 120 and remains at "1" as long as erroneous multiplets are present in encoder 120. Signal Sel switches back to 0 when the last bit of the last erroneous multiplet comes out of encoder 120, or in other words, until introduction of the 6-th bit of the next correct multiplet.

Decoding device 111 further comprises a decoding unit 125, also called decoder 125, connected to the output of multiplexer 123. Decoder 125 is of same structure as decoder 100. Since decoder 125 receives a number of bits known with certainty, it necessarily provides a signal exhibiting less errors than the signal provided by decoder 100 and the signal at the output of the circuit according to the present invention exhibits less errors than prior art signals.

A second embodiment of decoding device 111 will now be described in relation with FIG. 13 to 15.

Figure 13:
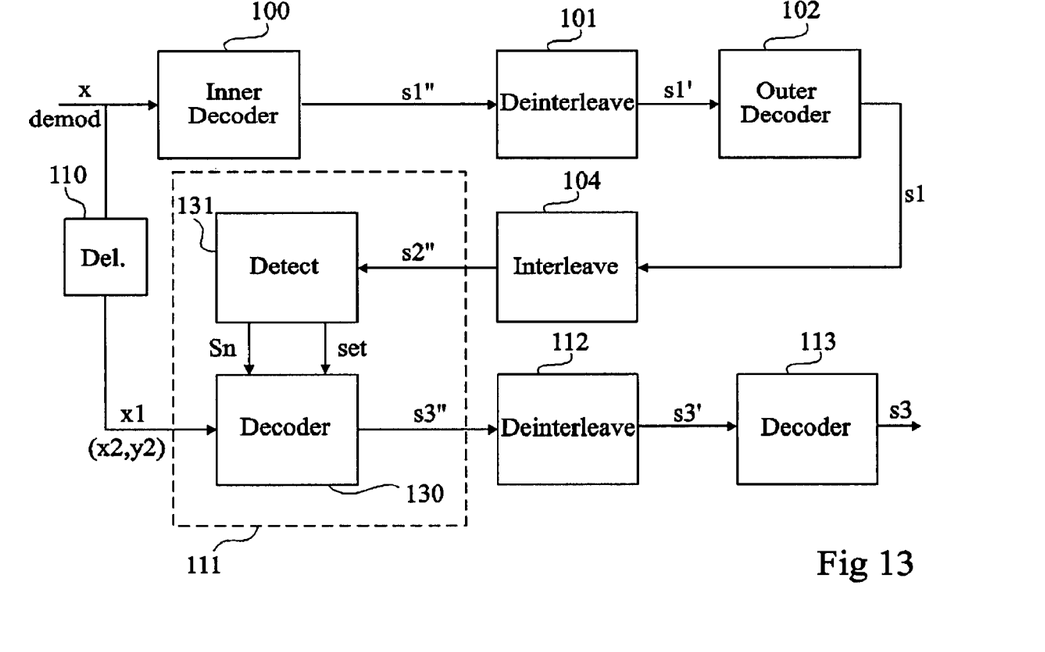
FIG. 13 is a diagram of another embodiment of the circuit of FIG. 9.

FIG. 13 shows the circuit of FIG. 9 with a detailed representation of a second embodiment of decoding device 111, particularly well adapted to the case where the encoder internal to the transmission has been a convolutional encoder. It is assumed in the description of FIG. 13 to 15, but not so limited, that the signal has been coded by means of a circuit such as that in FIG. 1, in which the external encoder is a Reed Solomon-type encoder and the internal encoder is a convolutional encoder with 6 flip-flops, as in FIG. 4. It is also assumed that in FIG. 13, decoder 100 is a decoder using a Viterbi algorithm. Input signal x comprises couples of two values processed in parallel, as well as delayed input signal x1.

In FIG. 13, decoding device 111 comprises a decoding unit 130, also called decoder 130, which receives signal x1 coming out of delay device 110. Decoding device 111 further comprises a detection device 131 noted "detect" which receives signal s2" provided by interleave device 104. Detection device 131 provides decoder 130 with a positioning signal "set" and a state signal $S_n$. Decoder 130 uses a modified Viterbi algorithm according to the present invention and provides a signal s3" to deinterleave device 112.

Detection device 131 analyzes signal s2" to identify its correct multiplets. For each correct multiplet, the detection device intervenes on the operation of decoder 130. Referring to the modeling of the method implemented by a Viterbi decoder previously described in relation with FIG. 7, detection device 131 intervenes to accelerate and make more reliable the lattice arrow elimination process.

Figure 14:
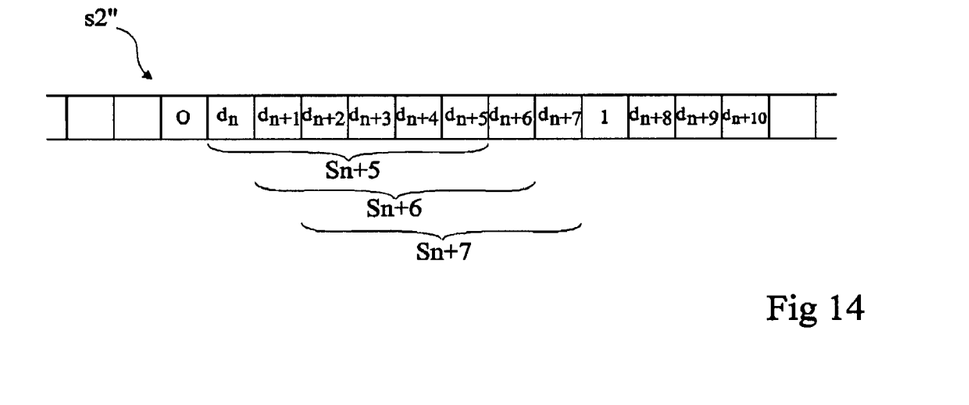
FIG. 14 is a diagram illustrating a signal provided by a device of the circuit of FIG. 13.

FIG. 14 is a representation of signal s2" enabling illustrating the operation of detection device 131. Signal s2" corresponds, to within the errors, to signal S" provided to internal encoder 3 of the associated transmit circuit, using the reference numerals of FIG. 1. Now, knowing the equivalent of signal S', it is possible to determine what the state Sn of the flip-flops of the internal encoder of the transmit circuit, here encoder 15 of FIG. 4, was at a time n corresponding to the introduction into flip-flop 20 of the n-th bit of signal S". Call $d_n$ the bit of signal s2" corresponding to the n-th bit of signal S". During the operation performed by decoder 130 to eliminate the arrows of an initially complete lattice, the knowing of a state Sn of the convolutional encoder of the transmit circuit enables identifying in the corresponding column at state Sn the circle through which the final single path of the lattice runs. Thus, for each correct multiplet of signal s2", if $d_n$ corresponds to the first bit of the multiplet, the corresponding states $S_{n+5}$, $S_{n+6}$, and $S_{n+7}$ of the associated convolutional encoder can be deduced with certainty, based on the bits of this multiplet. The first six bits of the multiplet provide state $S_{(n+5)}$, the bit sequence from the 2nd to the 7th bit provides state $S_{(n+6)}$, and the bit sequence from the 3rd to the 8th bit provide state $S_{(n+7)}$. A circle through which the final path runs can, after, be identified for each column corresponding to one of these states. Thus, for example, if the first six bits of the considered correct multiplet are 001010, the circle "selected" from the column corresponding to state $S_{(n+5)}$ is the circle associated with possible state 001010 of the flip-flops of the encoder of FIG. 4.

Figure 15:
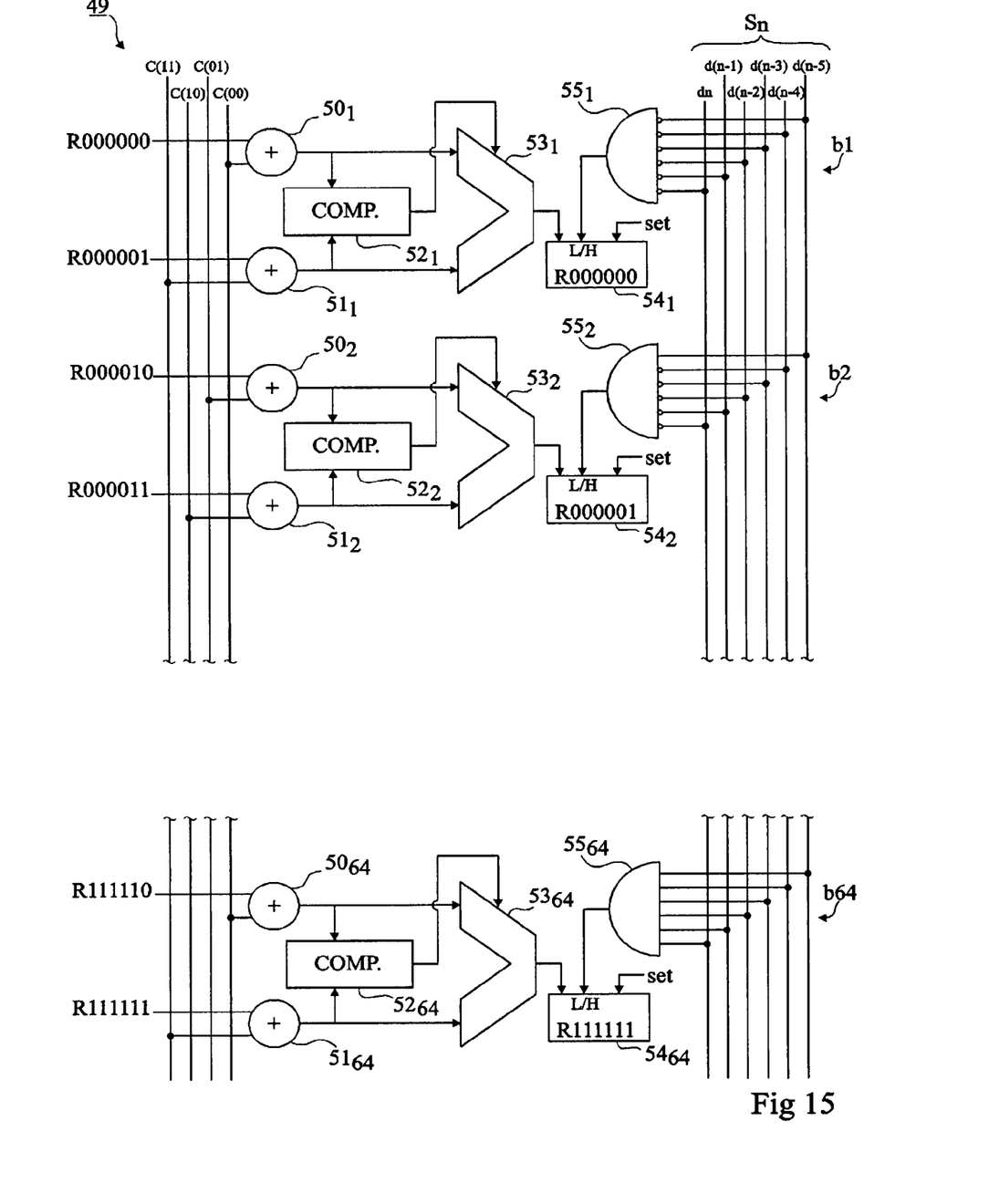
FIG. 15 is a diagram of a portion of a decoding device according to the present invention.

FIG. 15 is a diagram of a circuit 49 corresponding to a portion of decoder 130 enabling implementing the abovementioned process. Circuit 49 comprises 64 blocks b1 to b64 comprising the same elements as the blocks of the decoder of FIG. 8. As for the decoder of FIG. 8, the j-th block, with j ranging between 1 and 64, comprises two adders $50_j$ and $51_j$ connected to a comparator $52_j$ and to two inputs of a multiplexer $53_j$. The output of multiplexer $53_j$ is connected to a register $54_j$. Multiplexer $53_j$ is controlled by comparator $52_j$.

Register $54_j$ is used to store the metrics associated with the j-th circle of the n-th column of the lattice corresponding to a state $S_n$. First register $54_1$ is called R000000 since it is associated with possible state $S_n$ "000000", and so on until register $54_{64}$, which is called R111111 since it is associated with possible state $S_n$ "111111".

Further, an estimating device, not shown, calculates, on arrival of each new couple of signal x1, four cost values c(00), c(10), c(01), and c(11) for each of the 4 couples of possible values of the signals, as described previously in relation with FIG. 6 to 8. The values of the four costs c(00), c(01), c(10), and c(11) are provided on lines also designated as c(00), c(01), c(10), and c(11) in FIG. 15.

In the case of the first block b1, the inputs of adder $50_1$ are connected to register R000000 and to line c(00). The inputs of adder $51_1$ are connected to register R000001 and to line c(11). Generally, the connections to adders $50_j$ and $51_j$ of the j-th block can be deduced from a diagram of the type of that in FIG. 6, but made for a convolutional encoder with 6 flip-flops such as that in FIG. 4.

To enable detection device 131 to act on registers $54_1$ to $54_{64}$ of the decoder, each block $b_j$ further comprises a logic AND-type gate $55_j$ comprising six active inputs on a level 0 or 1. A small circle is shown in front of an input when it is active on a 0 level. The output of such an AND gate is equal to 1 when all its inputs are active, and equal to 0 when at least one of the inputs is not active. The six inputs of each AND gate are connected to six data lines $d_n$, $d_{(n-1)}$, $d_{(n-2)}$, $d_{(n-3)}$, $d_{(n-4)}$, $d_{(n-5)}$. Data line $d_n$ indicates the values, 0 or 1, of the n-th information bit of signal s2". Data line $d_{(n-1)}$ indicates the value, 0 or 1, of the (n−1)-th information bit of signal s2", and so on. It should be noted that data $d_n$ to $d_{(n-5)}$ correspond to state $S_n$ indicated by detection device 131. Further, the AND gate of the j-th block is connected to a control input L/H of register $54_j$. Further, each register $54_j$ is controlled by the set signal provided by detection device 131.

AND gates $55_1$ to $55_{64}$ are all different, so that for a state $S_n$ given by device 131, a single AND gate is set to 1, that is, provides a 1. AND gate $55_1$ connected to register $54_1$ "R000000" need to be set to 1 when the state $S_n$ presented on lines $d_n$ to $d_{(n-5)}$ is 000000. For this purpose, all the inputs of AND gate $55_1$ are active on a low level 0. Generally, AND gate $55_j$ connected to register $54_j$ "$Rx_1x_2x_3x_4x_5x_6$", where $x_1$ to $x_6$ are bit values, need to be set to 1 when the state $S_n$ presented on lines $d_n$ to $d_{(n-5)}$ is equal to $x_1x_2x_3x_4x_5x_6$. Thus, the first input of AND gate $55_j$ connected to line $d_n$ is active at 0 or at 1 respectively according to whether $x_1$ is equal to 0 or 1. Similarly, the second input of AND gate $55_j$ connected to line $d_{(n-1)}$ is active at 0 or 1 respectively accordingly to whether $x_2$ is equal to 0 or 1, and so on for each of the inputs of AND gate $55_j$.

Via the set signal and state signal Sn, detection device 131 can act on registers $54_1$ to $54_{64}$ so that they store a low or high metrics value. A possible operating mode of detection device 131 is the following. Detection device 131 continuously stores the last six received bits of signal s2". For each new bit of signal s2", device 131 updates the value of the state signal $S_n$ provided to decoder 130 to update data lines $d_n$ to $d_{(n-5)}$. The set signal is by default inactive, for example, at level "0", registers $54_1$ to $54_{64}$ then storing the values provided by multiplexers $53_1$ to $53_{64}$. When device 131 detects a correct multiplet, having a validity bit at "0", it waits to have received the sixth bits of the multiplet to active the set signal. Register 54 stored a value corresponding to the metrics associated with the current state $S_n$ is then assigned a low value, for example, equal to 0. The other registers are assigned a high value, for example, equal to the maximum value that can be stored by a register 54. Generally, the value assigned to a register $54_j$ is low or high according to whether the logic level at the output of the associated AND gate $55_j$ respectively is 1 or 0. On reception of the 7-th and 8-th bits of the multiplet, device 131 maintains signal set active at 1. State signal $S_n$ is updated after reception of each of these bits and each register 54 is positioned at a low or high value according to whether the metrics value associated with the considered register corresponds or not to the new states $S_n$. Once the state $S_n$ obtained after reception of the last bit of the multiplet has been taken into account by registers 54 of decoder 130, detection device 131 deactivates signal set. The operations described hereabove are repeated for each correct multiplet received by detection device 131. Of course, in the case where several correct multiplets follow one another, it is not necessary to provide for signal set to be deactivated between two correct multiplets.

Referring to the modeling in the form of a lattice of the process implemented by decoder 130, in the previously-described operating mode of detection device 131, the circles through which the final path runs are accurately determined for a number of columns, for example, a little less than 3 columns out of 8. This accurate determination enables simplifying and making reliable the arrow elimination process. Accordingly, the signal provided by decoder 130 comprises fewer errors than the signal provided by decoder 100 of chain A of the circuit.

As a result, as previously, decoder 113 will enable correcting more errors than decoder 102 and the signal provided by the circuit of the present invention will exhibit fewer errors than the signals decoded according to prior art.

Generalizations of the circuits and methods according to the present invention are within the abilities of those skilled in the art. For example, a decoding circuit according to the present invention may comprise a number M of decoding chains greater than two, the error-free portion(s) of the signal of the j-th chain being used on decoding of chain j+1.

The above-described circuit examples are non limiting and may be modified by those skilled in the art without departing from the context of the present invention. For example, decoder 130 may use other means than those described (setting to a minimum the metrics associated with the certain state, setting to a maximum the metrics associated with the other states) it take into account the certain states of signal s2".

Further, the two decoding chains A and B of the present invention may be formed based on existing devices normally provided for other purposes.

Figure 16:
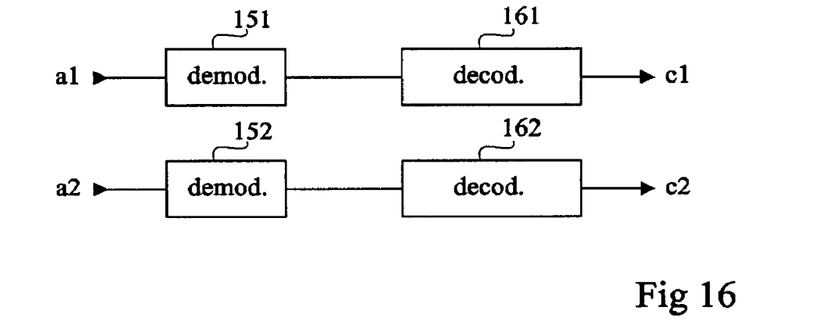
FIG. 16 is a conventional diagram of a "dual-channel" receive circuit enabling processing two coded signals.

A conventional "dual-channel" receive circuit such as illustrated in FIG. 16 may for example be provided. The circuit of FIG. 16 comprises two channels enabling processing two different coded signals, each received on an input a1 or a2. To reach inputs a1 and a2, although this has not been shown, each channel generally comprises an antenna and a reception device or tuner. Each channel further comprises a demodulator 151, respectively 152, and a decoding circuit 161, respectively 162, for example, identical to the circuits of FIG. 2. Two decoded signals are provided on outputs c1, c2. This type of circuits for example exists in television sets enabling viewing a television channel, while another chain is recorded by a recorder.

Figure 17:
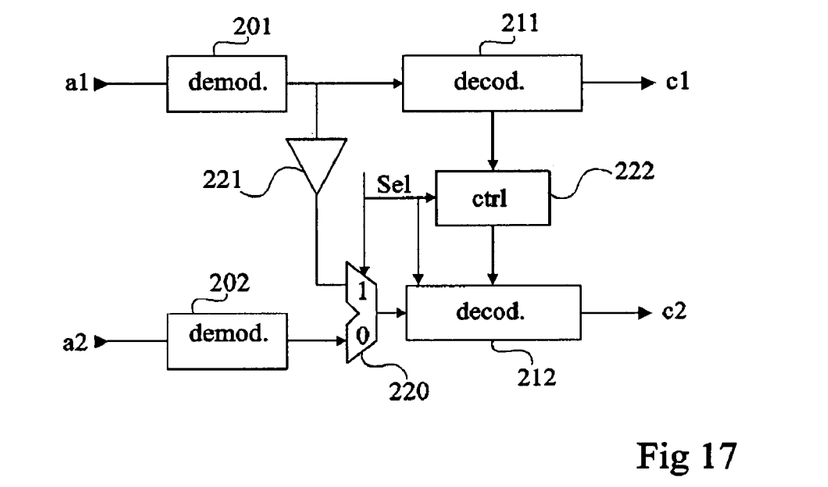
FIG. 17 is a diagram according to an embodiment of the present invention of a dual-channel receive circuit that can operate as a "single-channel" receive circuit.

FIG. 17 illustrates a first example showing how the conventional circuit of FIG. 16 can be converted into a "single-channel" reception signal according to the present invention. The circuit of FIG. 17 comprises a first channel comprising a demodulator 201 coupled to a decoding circuit 211, and a second channel comprising a demodulator 202 coupled to a decoding circuit 212. The reception circuit further comprises a multiplexer 220 arranged between demodulator 202 and decoder 212, the output of demodulator 202 being connected to one of the two inputs of multiplexer 220. A delay device 221 is placed between the output of demodulator 201 and the second input of multiplexer 220. A control device 222 receives signals provided by decoder 211 and can control decoder 212. A selection signal Sel controls multiplexer 220, control device 222, and decoding circuit 212.

Control device 222 comprises means for generating a signal corresponding to a corrected version of the signal provided by decoding circuit 211. Control device 222 further comprises means for controlling decoder 212. Decoding circuits 211, 212 must further be "adapted", that is, exhibit a structure partially different from that of decoding circuits 161, 162 of the circuit of FIG. 16, so that control device 222 can control or access elements of these circuits.

The circuit of FIG. 17 can operate according to two different modes. When the circuit of FIG. 17 operates as a dual-channel reception circuit, selection signal Sel is set, for example to 0, so that decoding circuit 212 receives the coded signal provided by demodulator 202. Control device 222 is then inactive. Decoding circuit 212 then conventionally processes the signal received by demodulator 202 and output signals c1 and c2 correspond to input signals a1 and a2.

When the circuit of FIG. 17 operates as a single-channel receive circuit according to the present invention, selection signal Sel is set to "1" so that decoding circuit 212 receives delayed signal a1 provided by delay device 221. Control device 222 is then activated. Decoder 212 then processes all or part of delayed signal a1 according to the control signals provided by control device 222. Control device 222 will for example be formed from the previously-described examples of decoding circuits according to the present invention. Decoding circuit 211 and the means for generating the corrected signal of control device 222 then form the equivalent of a decoding chain A of a circuit according to the present invention. Delay device 221 and the control means of control device 222 form the equivalent of a decoding chain B of a circuit according to the present invention.

A possible use of the circuit of FIG. 17 may be the following. In case of a reception of two distinct channels, a1 and a2, for example in case of the recording of a program while another program is being viewed, the circuit of FIG. 17 is used in dual-channel reception. When only one channel needs to be received, the circuit of FIG. 17 is used in single-channel reception according to the present invention and exhibits a signal of better quality. Signal Sel may be actuated manually or automatically, for example, if a program is viewed while another one is recorded, it may be provided to automatically pass to single-channel reception at the end of the recording.

Figure 18:
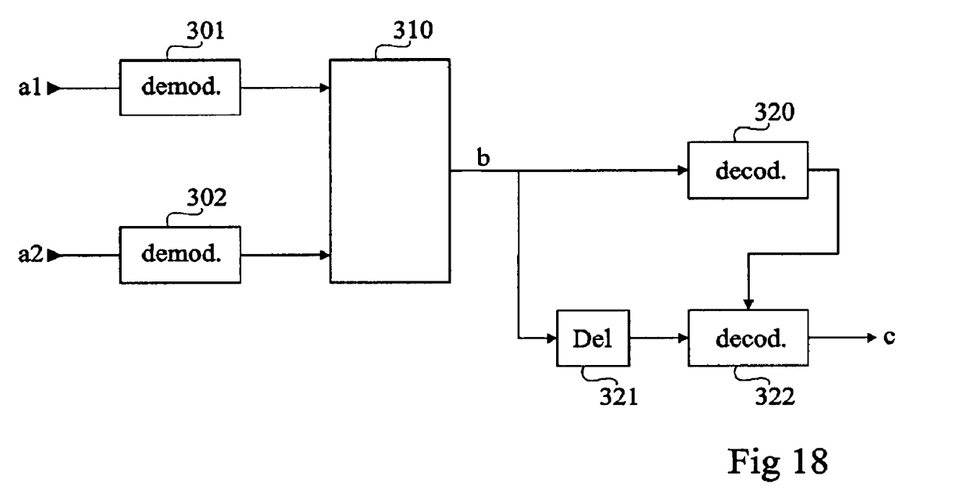
FIG. 18 is a diagram according to a second embodiment of the present invention.

FIG. 18 illustrates a second example showing how the conventional circuit of FIG. 16 may be converted into a "single-channel" receive circuit according to the present invention.

In FIG. 18, input a1 is coupled to a demodulator 301 which demodulates the signal received by the first channel. Input a2 is coupled to a demodulator 302 which demodulates the signal received by the second channel. The outputs of demodulators 301 and 302 are coupled to a recombination device 310 which provides a signal b. In the example of FIG. 18, the two channels are not necessarily tuned to the same receive frequency but each provide a signal corresponding to the same transmitted information. Recombination device 310 selects the best portions of the signals provided by demodulators 301, 302 to form signal b. For example, in mobile reception, two antennas placed at two distinct locations of a vehicle generally provide signals exhibiting different signal-to-noise ratios and signal b will be formed of the best signal. Also, in COFDM modulation, certain sub-carrier frequencies will be better received by a channel and signal b will be a mixture of the two channels with the least noisy sub-carriers.

Signal b is then provided to a decoder 320 and, via a delay element 321, to a decoder 322. Decoder 320 corresponds to prior art decoder 161. Decoder 322, as for itself, has been modified to be able to use, according to the present invention, all or part of the correct information of the signal provided by decoder 320. Signal c, provided by decoder 322, thus exhibits less errors than the prior art signal.

The example of FIG. 18 is particularly advantageous in that the two demodulators and the two decoders of the conventional circuit of FIG. 16 are all used to improve the signal quality.

Figure 19:
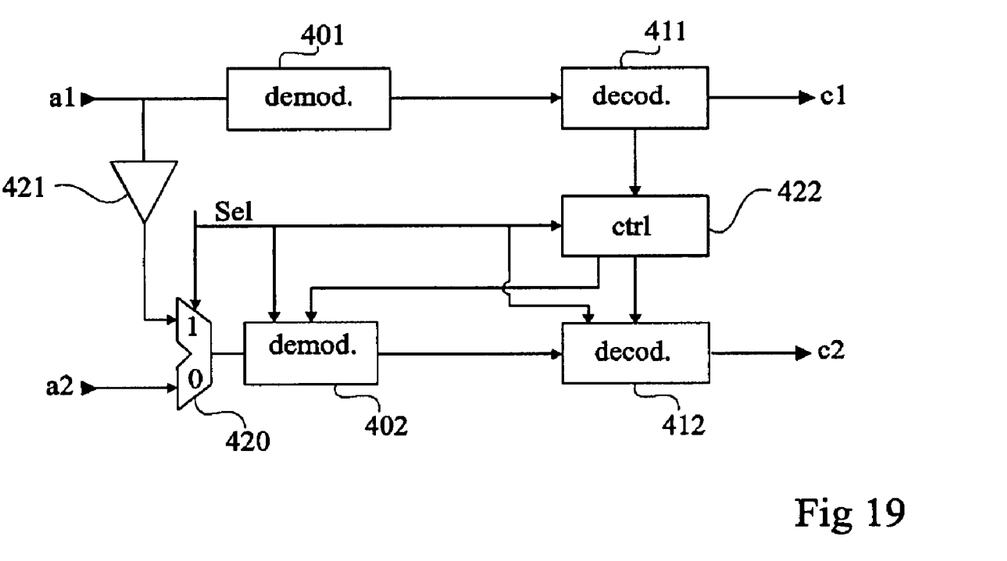
FIG. 19 is a diagram according to another embodiment of the present invention of a dual-channel receive circuit that can operate as a "single-channel" receive circuit.

FIG. 19 illustrates another example showing how the conventional circuit of FIG. 16 can be converted into a "single-channel" reception signal according to the present invention. The circuit of FIG. 19 comprises a first channel comprising a demodulator 401 coupled to a decoding circuit 411, and a second channel comprising a demodulator 402 coupled to a decoding circuit 412. The reception circuit further comprises a multiplexer 420 arranged upstream of demodulator 402, the output of the multiplexer 420 being connected to the input of demodulator 402. A first input of multiplexer 420 receives the input signal a2 of the second canal. A delay device 421 is placed between the input of demodulator 401 and the second input of multiplexer 420. A control device 422 receives signals provided by decoder 411 and can control demodulator 402 and decoder 412. A selection signal Sel controls multiplexer 420, control device 422, demodulator 402 and decoding circuit 412.

Control device 422 comprises means for generating a signal corresponding to a corrected version of the signal provided by decoding circuit 411. Control device 422 further comprises means for controlling demodulator 402 and decoder 412. Demodulation circuit 402 and decoding circuits 411, 412 must further be "adapted", that is, exhibit a structure partially different from that of demodulation circuit 152 and decoding circuits 161, 162 of the circuit of FIG. 16, so that control device 422 can control or access elements of these circuits.

The circuit of FIG. 19 can operate according to two different modes. When the circuit of FIG. 19 operates as a dual-channel reception circuit, selection signal Sel is set, for example to 0, so that demodulation circuit 402 receives input signal a2. Control device 422 is then inactive. Demodulation circuit 402 and decoding circuit 412 then operate conventionally and output signals c1 and c2 correspond to input signals a1 and a2.

When the circuit of FIG. 19 operates as a single-channel receive circuit according to the present invention, selection signal Sel is set to "1" so that demodulation circuit 402 receives delayed signal a1 provided by delay device 421. Control device 422 is then activated. Demodulator 402 and decoder 412 then processes all or part of delayed signal a1 according to the control signals provided by control device 422. Control device 422 will for example be formed from the previously-described examples of decoding circuits according to the present invention. More precisely, for the control of demodulator 402, control device 422 comprises a corresponding modulation circuit. Decoding circuit 411 and the means for generating the corrected signal of control device 422 then form the equivalent of a decoding chain A of a circuit according to the present invention. Delay device 421 and the control means of control device 422 form the equivalent of a demodulation and decoding chain B of a circuit according to the present invention. Since demodulator 402 receives modulated signal portions for which the obtained bits are known with certainty, it necessarily provides a signal exhibiting less errors than the signal provided by demodulator 401 and the signal at the output of the circuit according to the present invention exhibits less errors than prior art signals.

A possible use of the circuit of FIG. 19 may be the following. In case of a reception of two distinct channels, a1 and a2, for example in case of the recording of a program while another program is being viewed, the circuit of FIG. 19 is used in dual-channel reception. When only one channel needs to be received, the circuit of FIG. 19 is used in single-channel reception according to the present invention and exhibits a signal of better quality. Signal Sel may be actuated manually or automatically, for example, if a program is viewed while another one is recorded, it may be provided to automatically pass to single-channel reception at the end of the recording. Of course, the present invention is not limited to the above-described circuits and those skilled in the art will bring any useful modification without departing from the context of the present invention. For example, although this has not been described, the circuit of FIG. 18 may be adapted to also enable the "dual-channel" reception of FIG. 16.

It should further be noted that the applications of the present invention are many and various. A typical example of use is mobile telephony, where the signal is generally very noisy.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A receive apparatus comprising:
   first and second receive channels configured to receive first and second distinct modulated and coded signals, the first receive channel comprising a first demodulator capable of receiving the first modulated and coded signal and of providing a first coded signal to a first decoding system and the second receive channel comprising a second demodulator coupled to a second decoding system, the first decoding system being capable of receiving the first coded signal and of providing a first decoded signal comprising portions considered correct;
   a delay device having an input connected to the input or the output of the first demodulator;
   a multiplexer with two inputs and one output, a first input of the multiplexer being coupled to the delay device and a second input of the multiplexer coupled to the output of the second demodulator or configured to receive a second modulated and coded signal, the output of the multiplexer being coupled to the input of the second demodulator or the input of the second decoding system;
   a control device comprising means for generating a corrected signal from signals provided by the first decoding system and means for controlling the second decoding system and/or the second demodulator; and
   a circuit capable of providing a selection signal controlling the multiplexer and the control device, wherein, when the selection signal is positioned to let through the signal provided by the delay device, the second decoding system and/or the second demodulator are capable of providing a second decoded signal from the first coded signal or the first modulated and coded signal and from the portions considered correct of the first decoded signal.

2. The receive apparatus of claim 1, wherein the first decoding system comprises a first decoder, a first deinterleave device coupled to the first decoder, and a second decoder coupled to the first deinterleave device, and wherein the second receive system comprises a third decoder, a second deinterleave device coupled to the third decoder, and a fourth decoder coupled to the second deinterleave device.

3. The receive apparatus of claim 2, wherein the third decoder is coupled to the delay device configured to receive the first coded signal and to the second decoder via an interleave device.

4. The receive apparatus of claim 3, wherein the signal provided by the interleave device is formed of multiplets comprising validity bits indicating whether the multiplets are correct.

5. The receive apparatus of claim 2, wherein the first decoder is a decoder configured to use a Viterbi algorithm, and wherein the second and fourth decoders are error-correction decoders of Reed-Solomon type.

6. The receive apparatus of claim 2, wherein the third decoder comprises a set of registers configured to store a periodically-updated metric, and control means capable of forcing the content of the registers to a determined value according to the values of the first decoded signal provided by the first decoding system.

7. The receive apparatus of claim 6, wherein the control means is configured to detect the correct multiplets of the first decoded signal and to control the positioning of the registers for each sequence of n consecutive bits belonging to correct multiplets.

8. The receive apparatus of claim 3, wherein the third decoder comprises an encoder coupled to the interleave device and a multiplexer configured to receive respectively on first and second inputs the first demodulated signal provided by the delay device and a coded signal provided by the encoder and further configured to provide a signal to a fifth decoder, the multiplexer configured to be controlled by a control device responsive to the validity of the signal supplying the encoder.

9. A method of receiving coded signals, the method comprising: receiving, on a first receive channel of a receive apparatus, a first coded signal;
   first decoding, on the first receive channel, the first coded signal to provide a first decoded signal;
   selectably receiving, on a second receive channel of the receive apparatus, a second coded signal distinct from the first coded signal or a first channel signal that is based upon the first decoded signal from the first receive channel; and second decoding, in the second receive channel, the first channel signal responsive to selectably receiving the first channel signal;

identifying first portions of the first decoded signal as correctly decoded; identifying second portions of the first decoded signal as incorrectly decoded; configuring, by a control circuit, the second receive channel to receive the first channel signal responsive to detection of at least one correctly decoded first portion of the first decoded signal; and configuring, by a control circuit, the second receive channel to receive a delayed first coded signal responsive to detection of at least one incorrectly decoded second portion of the first decoded signal; and wherein the control circuit comprises a multiplexor for the acts of configuring.

10. The method of claim 9, wherein the act of second decoding provides a version of the first decoded signal of better signal quality than the first decoded signal.

11. The method of claim 9, wherein the act of first decoding comprises using a Viterbi algorithm and Reed-Solomon error correction.

12. The method of claim 9, wherein the act of second decoding comprises using a modified Viterbi algorithm and Reed-Solomon error correction.

13. The method of claim 9, wherein the act of first decoding comprises de-interleaving a signal in the first receive channel and the act of second decoding comprises de-interleaving a signal in the second receive channel.

14. The method of claim 9, further comprising interleaving the first decoded signal and providing the interleaved first decoded signal to the second receive channel for the act of second decoding.

15. The method of claim 9, wherein the act of selectably receiving comprises manual selection and/or an automatic selection.

16. A receiver comprising: a first receive channel configured to receive a first coded signal; a second receive channel selectably configurable to receive a second coded signal distinct from the first coded signal or a first channel signal that is based upon a first decoded signal from the first receive channel; and means for decoding, in the second receive channel, the first channel signal responsive to selectably receiving the first channel signal, wherein the means for decoding comprises: at least one multiplexer; a control circuit coupled to the at least one multiplexer; a first decoder coupled to an output of the at least one multiplexer; and a second decoder coupled to the first decoder; and wherein the first channel signal includes validity bits identifying first portions of the first decoded signal as correctly decoded and second portions of the first decoded signal as incorrectly decoded, and the control circuit is adapted to configure the at least one multiplexer to admit or not admit portions of the first channel signal based upon values of the validity bits.

17. The receiver of claim 16, wherein the means for decoding includes providing a version of the first decoded signal of better signal quality than the first decoded signal.

18. The receiver of claim 16, wherein the second receive channel is selectably configurable manually and/or automatically.

19. The receiver of claim 16, wherein the at least one multiplexer comprises a first multiplexer having a first input coupled to an output of the first receive channel, a second input configured to receive a delayed version of the first coded signal, and an output coupled to the second receive channel.

20. The receiver of claim 19, wherein the at least one multiplexer further comprises a second multiplexer having an input configured to receive the second coded signal and having an output coupled to the second receive channel.

21. The receiver of claim 16, further comprising an interleaver coupled between an output of the first receive channel and an input of the first decoder.

22. The receiver of claim 16, wherein first decoder is configured to implement a modified Viterbi algorithm and the second decoder is configured to implement Reed-Solomon error correction.

* * * * *